United States Patent [19]

Nishizawa et al.

[11] Patent Number: 4,536,946
[45] Date of Patent: Aug. 27, 1985

[54] METHOD FOR FABRICATING SEMICONDUCTOR PHOTODETECTOR

[75] Inventors: Junichi Nishizawa, No. 6-16, Komegafukuro 1-chome, Sendai-shi, Miyagi, Japan; Sobei Suzuki; Takashige Tamamushi, both of Miyagi, Japan

[73] Assignee: Junichi Nishizawa, Japan

[21] Appl. No.: 561,103

[22] Filed: Dec. 13, 1983

[30] Foreign Application Priority Data

Dec. 13, 1982 [JP] Japan ............................. 57-218591

[51] Int. Cl.$^3$ ............................................. H01L 21/22
[52] U.S. Cl. ...................................... 29/571; 29/572; 29/578; 148/187
[58] Field of Search .................... 29/571, 572, 578; 148/187

[56] References Cited

U.S. PATENT DOCUMENTS

| | | | |
|---|---|---|---|
| 4,377,900 | 3/1983 | Nonaka et al. | 29/571 |
| 4,409,725 | 10/1983 | Hotta et al. | 29/571 |
| 4,449,284 | 5/1984 | Shimbo | 29/571 |
| 4,466,175 | 8/1984 | Coe | 148/187 X |
| 4,499,654 | 2/1985 | Nishizawa et al. | 29/571 |
| 4,502,203 | 3/1985 | Nishizawa et al. | 29/572 X |
| 4,505,022 | 3/1985 | Briere | 29/571 |

*Primary Examiner*—George T. Ozaki
*Attorney, Agent, or Firm*—Sughrue, Mion, Zinn, Macpeak, and Seas

[57] ABSTRACT

A semiconductor photodetector, and a process for producing a semiconductor photodetector, having a shielding gate region isolated from drain or source regions with only a small junction capacitance therebetween. The photodetector is implemented with a vertical static induction transistor. In the static induction transistor, a control gate region is formed on a first principal surface of a silicon wafer. The shielding gate region is formed on the principal surface surrounding the control gate region. At least one first principal electrode region is formed on the first principal surface between the control region and the shielding gate region. A second principal electrode region is formed on a second principal surface of the wafer on the side thereof opposite the first principal electrode region. The shielding gate region is formed in the silicon wafer at a position deeper than the first principal electrode region.

10 Claims, 29 Drawing Figures

METHOD FOR FABRICATING SEMICONDUCTOR PHOTODETECTOR

BACKGROUND OF THE INVENTION

The present invention relates to a semiconductor photodetector and a process for producing the same. More particularly, the invention relates to a semiconductor photodetector implemented with a single SIT (Static Induction Transistor) or an array of SITs, and a process for producing the same.

Figure 1:
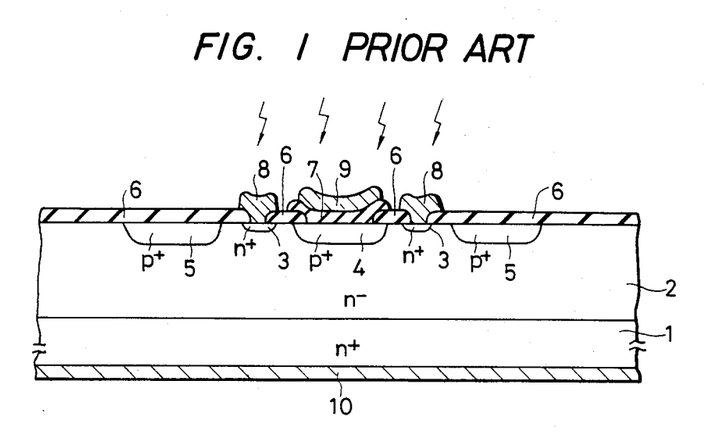
FIG. 1 is a schematic cross section of a conventional SIT.

A semiconductor imaging device using single-SIT pixels having both light detecting and switching capabilities has recently been developed by the present inventors. (See Japanese Patent Applications No. 204656/81, filed Dec. 17, 1981, and No. 157693/82, filed Sept. 9, 1982.) A cross section of an SIT used in such an imaging device is shown in FIG. 1. This device includes an $n^+$ type Si substrate 1 having thereon an $n^-$ type epitaxial layer 2 in which are formed an $n^+$ type drain region 3, a $p^+$ type control gate region 4, and a $p^+$ type shielding gate region 5. The $p^+$ shielding gate region 5, which is formed around the $n^+$ drain region 3 and $p^+$ control gate region 4, serves to isolate two adjacent SIT pixels by a depletion layer. The $n^+$ substrate 1 provides a source region common to all pixels. The $n^+$ drain region 3 is connected to a drain electrode 8, the source region 1 to a source electrode 10, and the control gate region 4 to a control gate electrode 9 through a gate capacitor made of a gate insulating layer 7.

Figure 2:
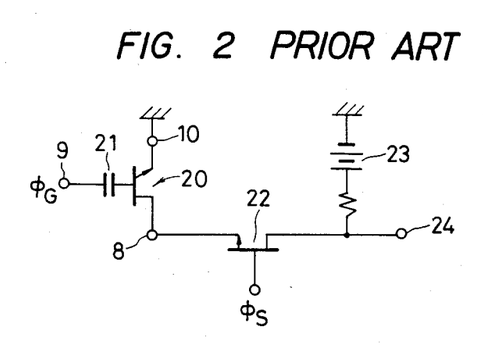
FIG. 2 is a diagram of a circuit used for reading signals from the SIT of FIG. 1.

The equivalent circuit of the device of FIG. 1 is shown in FIG. 2, wherein a vertical SIT 20 and a gate capacitor 21 are formed within electrodes 8, 9 and 10. The source electrode 10 is grounded, the control gate electrode 9 is supplied with a readout pulse signal $\phi_G$, and the drain electrode 8 is connected to a biasing circuit 23 and a readout terminal 24 through a switch 22 that turns on in response to pulses of a video line selecting signal $\phi_S$.

When the SIT pixel is biased and illuminated with light, an equal number of electrons and holes are formed in the neighborhood of the control gate electrode 4. The electrons enter the source electrode 10 where they are collected, whereas the holes accumulate in the control gate electrode 4, which floats with respect to d.c. current flowing through the gate capacitor 21. When a positive gate pulse of the signal $\phi_G$ is applied through gate capacitor 21, the barrier potential of the true gate is lowered sufficiently to allow current to flow into the SIT 20. The magnitude of the current flowing depends on the density of holes accumulated in the control gate 4, and ultimately by the amount of light received by the SIT pixel. The current is read out via terminal 24 as a video signal. As mentioned above, the function of the $p^+$ shielding gate region 5 is to statically isolate two adjacent SIT pixels having the configuration described above. Needless to say, $n^+$ region 3 may form a source region whereas $n^+$ region 1 forms a drain region.

An imaging device composed of an array of such SITs connected by the common shielding gate region is capable of performing light detection and switching for signal readout. This device can be fabricated easily and permits a very high packaging density as compared with the conventional imaging device using a separate light-detecting diode and MOS switching transistor. As a further advantage, an imaging device composed of an array of SITs connected by a common shielding gate region achieves an extremely high detection sensitivity for light, and hence is free from switching noise inherent in MOS transistors.

The imaging device described in Japanese Patent Applications Nos. 204656/81 and 157693/82 includes a matrix of SITs connected by a common shielding gate region, but it will be easily understood by those skilled in the art that a plurality of SITs may be arranged one-dimensionally (in a line) rather than two-dimensionally (in a matrix). Of course, an individual SIT unit can be used as a photoelectric converter. Therefore, the term "photodetector" as used in this specification means both an imaging device having a matrix or one-dimensional arrangement of SITs connected by a common shielding gate region, and a single-unit photoelectric converter formed of a single SIT.

A photodetector using an SIT having both light-detecting and switching capabilities has a great potential for use as a substitute for the conventional MOS type photodetector. As already mentioned, in an imaging device having an array of SITs, each SIT is isolated by a $p^+$ shielding gate region 5. If isolation by the shielding gate 5 is not adequate, part of the photocarriers generated in the channel region of each SIT leak into an adjacent SIT pixel. This means two adjacent SIT pixels interfere with each other, resulting in undesired effects such as reduced image sharpness. Another disadvantage resulting from insufficient isolation of adjacent SIT pixels by the shielding gate region 5 is that blooming can easily occur due to excess photocarriers generated in the control gate region 4 when the latter is illuminated with intense light. Sufficient isolation between SIT pixels can be achieved by providing the shielding gate region 5 with a sufficient width, but then the packing density of SIT pixels is accordingly reduced.

As shown in Japanese Patent Application No. 157693/82, an SIT having an increased sensitivity to light can be obtained by locating the $n^+$ drain region 3 closer to the shielding gate region 5. From a practical viewpoint though, the shielding gate region 5 should be electrically isolated from the drain region 3. However, if the drain region 3 is brought close to the shielding gate region 5 in an attempt to increase the light sensitivity of SIT, the two regions become insufficiently isolated and a fairly large junction capacitance is formed between them. Furthermore, if misalignment occurs in the fabrication process, the closely spaced drain region 3 and shielding gate region 5 may be short circuited, or nearly so.

A photodetector having SITs in the configuration shown in FIG. 1 has the disadvantage of insufficient isolation between SIT pixels by the $p^+$ shielding gate region 5. This problem becomes prominent when the $n^+$ drain region 3 is brought close to the shielding gate region 5 in order to provide a higher sensitivity to light.

Therefore, one object of the present invention is to provide a SIT photodetector having a shielding gate region capable of sufficient isolation of pixels to thus minimize interference between SIT pixels and to minimize blooming.

Another object of the present invention is to provide an SIT photodetector wherein the shielding gate region is adequately isolated from the drain (or source) region so that only a small junction capacitance is formed between the two regions and misalignment during fabrication will not cause the two regions to be short circuited easily.

A further object of the present invention is to provide a process for fabricating an SIT photodetector having the characteristics described above.

SUMMARY OF THE INVENTION

An SIT photodetector of the present invention that achieves these objects is characterized by a shielding gate region which is formed in a silicon wafer at a deeper position than a drain or source region. More specifically, the photodetector of the present invention comprises a vertical SIT including a control gate region formed on a first principal surface of a silicon wafer, a shielding gate region formed on the first principal surface surrounding the control gate region, at least one first principal electrode region formed on the first principal surface in the area defined by the control gate region and the shielding gate region, and a second principal electrode region formed on the second principal surface of the silicon wafer on the side opposite the first principal electrode region, characterized in that the shielding gate region is formed in the silicon wafer at a position deeper than the first principal electrode region.

The SIT photodetector of the present invention can be fabricated by either of two processes. According to one process, the shielding gate region is formed in such a manner that its top surface is flush with the surface of the silicon wafer. Then, an oxide film is formed in the upper part of the shielding gate region by selective oxidation, so that the remaining shielding gate region is positioned deeper in the silicon wafer than the drain or source region, which is formed in such a manner that its top is flush with the surface of the silicon water. According to the other process, a notch is formed in the silicon wafer by etching, and a shielding gate region is formed at the apex (bottom) of the notch. Then, an oxide film is formed in the upper part of the shielding gate region by oxidation so that the remaining shielding gate region is positioned deeper in the silicon wafer than the drain or source region, which is formed in such a manner that its top is flush with the surface of the silicon wafer.

The first mentioned method of the present invention concerns the fabrication of a photodetector constituted by a vertical SIT including a control gate region formed on the first principal surface of a silicon wafer, a shielding gate region formed on the first principal surface surrounding the control gate region, at least one first principal electrode region formed on the first principal surface in the area defined by the control gate region and the shielding gate region, and a second principal electrode region formed on the second principal surface of the silicon wafer on the side opposite the first principal electrode region. According to this first method, the first electrode region and shielding gate region are formed on the first principal surface in such a manner than the top of each of those regions is flush with the first principal surface. Then, part of the shielding gate region by an oxide film is formed in the upper selective oxidation so that the remaining shielding gate region is positioned deeper in the silicon wafer than the first principal electrode region.

According to the second method for fabricating a photodetector of the present invention, the first principal electrode region is formed on the first principal surface in such a manner that the top surface of that region is flush with the first principal surface. A notch is formed in the first principal surface by etching. Then, the shielding gate region is formed at the apex (bottom) of the notch and an oxide film is formed by oxidizing the upper part of the shielding gate region, whereupon the remaining shielding gate region is positioned deeper in the silicon wafer than the first principal electrode region.

DESCRIPTION OF THE PREFERRED EMBODIMENTS

Figure 3:
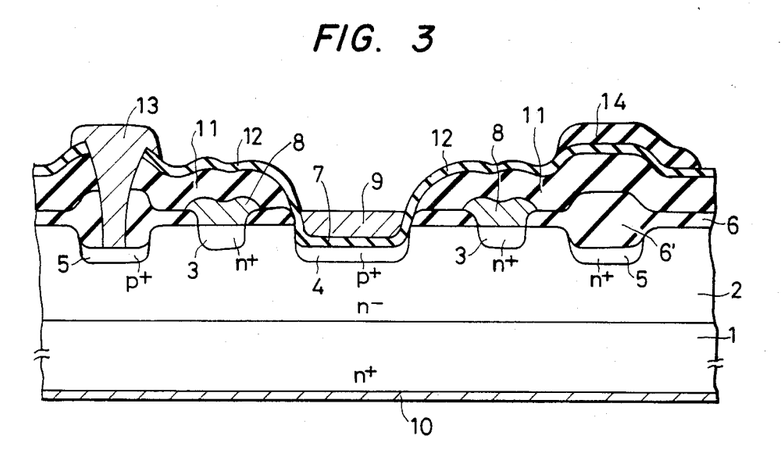
FIG. 3 is a schematic cross section showing a first preferred embodiment of an SIT forming a photodetector of the present invention.
Figure 5:
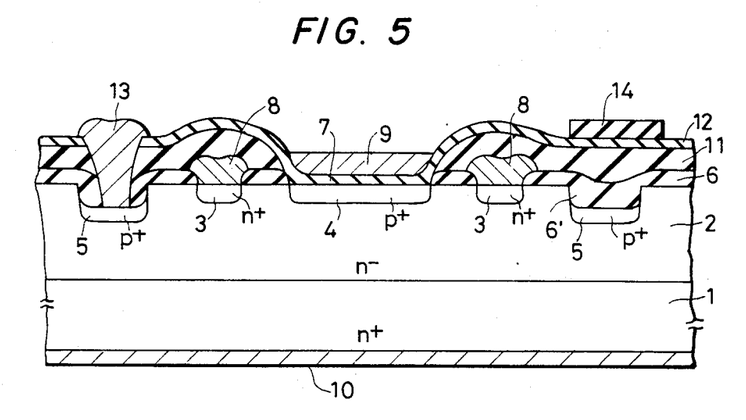
FIG. 5 is a schematic cross section showing another embodiment of an SIT forming a photodetector of the present invention.

A schematic cross section of an SIT photodetector constructed according to a preferred embodiment of the present invention is shown in FIG. 3. Another embodiment is shown in FIG. 5. In each of these figures, those parts identified by the same reference numerals in FIG. 1 refer to the same parts.

In either embodiment, a low resitivity $n^+$ Si substrate 1 is overlaid with a high resistivity $n^-$ epitaxial layer 2. In the surface of the epitaxial layer 2, a $p^+$ control gate region 4 is formed in such a manner that its top is positioned lower than the surface of the epitaxial layer 2 (FIG. 3) or flush with the surface of the epitaxial layer (FIG. 5). The surface of the epitaxial layer 2 is also provided with a $p^+$ shielding gate region 5 that surrounds the control gate region 4. In the embodiments of FIGS. 3 and 5, this shielding gate region is so positioned that its top is lower than the surface of the epitaxial layer 2 (in FIG. 3, the top of the shielding gate region is flush with that of the control gate region 4). An oxide film 6' is formed in the upper part of the gate region 5. It should be understood that the control gate region 4 and shielding gate region 5 need not have the same impurity concentration, and for the purpose of increasing the light sensitivity of SIT, the shielding gate region 5 may have a higher impurity concentration than the control gate region 4.

In the embodiments of FIGS. 3 and 5, an $n^+$ drain region 3 is formed in that part of the surface of the epitaxial layer 2 which is defined by the two gate regions 4 and 5. This drain region is so formed that its top surface is flush with the surface of the epitaxial layer 2. In other words, the shielding gate region 5 is positioned deeper in the epitaxial layer 2 than the drain region 3. This positional relationship is an important feature of the SIT photodetector of the present invention.

In the embodiments shown, the drain region 3 is formed on two symmetrical positions with respect to the control gate region 4 and at the midpoint between the control gate region 4 and shielding gate region 5 so that the drain region is spaced from each gate region by an equal distance. The only requirement that has to be met by the photodetector of the present invention is that at least one drain region 3 be formed in the part of the epitaxial layer 2 which is defined by the two gate regions 4 and 5 at a position shallower than the shielding gate region 5. The control gate region 4 may assume any positional relationship with the shielding gate region 5 in the transverse direction (that is, the direction perpendicular to the depth of the epitaxial layer 2).

On the top of the drain region 3 is formed a drain electrode 8 made of a first conductive material such as P-doped polycrystalline silicon (DOPOS). A source electrode 10, made of a metal such as aluminum, is formed on the entire surface of the Si substrate (n+ source region) on the side opposite to the drain electrode 8. The top of the control gate region 4 is provided with a transparent control gate electrode 9 made of a second conductive material (e.g. $SnO_2$) through a gate capacitor 7 made of a layer 12 of a second insulating material (e.g. $Si_3N_4$). The field area and the shielding gate region 5 are covered with an oxide film 6, and this oxide film 6 and the drain electrode 8 on the drain region 3 are covered with a layer 11 of a first insulating material such as phosphosilicate glass. Part of the shielding gate region 5 is connected to a shielding gate electrode 13 made of a metal such as aluminum. This shielding gate electrode 13 is formed by filling a metal such as aluminum into a contact hole cut into the second insulating layer 12, the first insulating layer 11 and oxide film 6 on the shielding gate region 5 by electron beam etching or sputtering. It is not necessary to form one shielding gate electrode 13 for every unit of SIT, and how many shielding gate electrodes are formed and in what positions should be determined by taking into consideration the number of SITs that make up the final photodetector and the resistance of the shielding gate region 5.

The outermost part of the shielding gate region 5 is covered with the light-shielding layer 14 made of a metal such as aluminum. This layer inhibits the undesired formation of electrons and holes in the neighborhood of the shielding gate region. This light-shielding layer is formed simultaneously, and hence integral with, the shielding gate electrode 13.

Unlike the conventional SIT of FIG. 1, the SIT shown in FIGS. 3 and 5 has a shielding gate region 5 completely buried within the epitaxial layer 2 (that is, the top of the shielding gate region is positioned lower than the surface of the epitaxial layer. This ensures significantly effective electrical isolation between pixels as compared with the shielding gate region formed in the SIT of FIG. 1. Therefore, the photodetector of the present invention constituted by SITs having the configuration shown in FIG. 3 or 5 has minimum interference between SIT pixels, and subsequently minimal blooming.

As another feature, the shielding gate region 5 is positioned deeper in the epitaxial layer 2 than the drain region 3. Due to this, compared with the case shown in Fig. 1, highly effective electrical isolation is achieved between the drain region 3 and the shielding gate region 5. As a result, even if the drain region 3 is brought close to the shielding gate region 5 in the transversal direction to provide a higher sensitivity to light, the junction capacitance between two regions will nevertheless be fairly small and the possibility of short circuiting the two regions due to misalignment during fabrication is minimized.

These advantages increase as the position of the shielding gate region 5 becomes deeper in the epitaxial layer 2. However, if the position of the region 5 is too deep, the electrical isolation between the gate region 5 and the Si substrate 1 (n+ source region) becomes insufficient. Therefore, the shielding gate region 5 should generally be positioned at least 1 micron above the top of the n+ source region 1.

As will be described below, the shielding gate region 5 of the SIT shown in FIG. 3 is prepared by first forming a p+ region in the epitaxial layer 2 in such a manner that the top of the region is flush with the surface of the epitaxial layer, and then forming an oxide film in the upper part of the region by selective oxidation (LOCOS) so as to leave the desired p+ shielding gate region in the lower part. On the other hand, the shielding gate region 5 of the SIT shown in FIG. 5 is prepared by first etching the epitaxial layer 2 to form a notch, then forming a p+ shielding gate region at the apex of the notch, and finally oxidizing the upper part of the region by LOCOS so as to leave the desired p+ shielding gate region in the lower part. As a consequence, the shielding gate region 5 formed in the SIT of notched gate type shown in FIG. 5 is generally positioned deeper in the epitaxial layer 2 than the shielding gate region 5 formed in the SIT of the LOCUS gate type shown in FIG. 3. Therefore, in most cases, a photodetector using the SIT of the notched gate type achieves better electrical isolation between SIT pixels than one using an SIT of the LOCUS gate type. As another advantage, by using plasma etching to cut a notch, the width of the shielding gate region formed in the SIT of the notched gate type can be reduced to about one-sixth of the width of the shielding gate region formed in the SIT of the LOCUS gate type. Therefore, more SITs of the notched gate type can be packaged into a photodetector than SITs of the LOCUS gate type.

In the SIT of the LOCUS gate type shown in FIG. 3, the control gate region 4 is located in the epitaxial layer at the same depth as the shielding gate region 5. Needless to say, the control gate region may be formed as in the SIT of the notched gate type shown in FIG. 5 so that the top of the gate region is flush with the surface of the epitaxial layer. From the viewpoint of light reception, this latter case is preferred.

The photodetector composed of an SIT of LOCUS gate type shown in FIG. 3 can be fabricated by the following process of the present invention, which will be best understood with reference to FIGS. 4A through 4L.

Figure 4A:
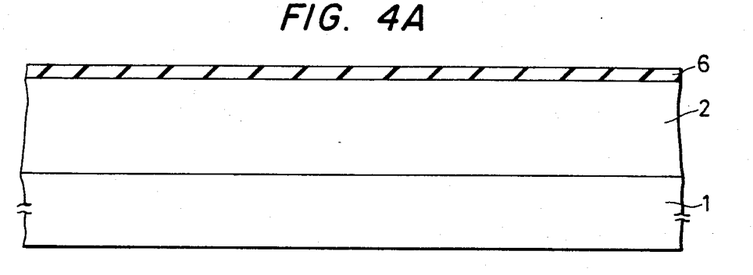
FIGS. 4A through 4L are schematic cross-sectional views illustrating a first process for fabricating the photodetector of the present invention.

Step A (FIG. 4A)

An n+ Si substrate 1 having a (111) surface plane and an impurity concentration of $10^{18}$ to $10^{20}$ cm$^{-3}$ is prepared. A suitable dopant is Sb or P; Sb is preferred for its small diffusion coefficient. An n− epitaxial layer 2 having an impurity concentration of $10^{13}$ to $10^{15}$ cm$^{-3}$ is formed on the Si substrate to give a thickness of 5 to 10 microns. Then, the wafer is exposed to an oxygen atmosphere for 25 to 60 minutes at 900 to 1000 degrees C. until a layer 6 of $SiO_2$ forms to a thickness of 100 to 500 Å.

Figure 4B:
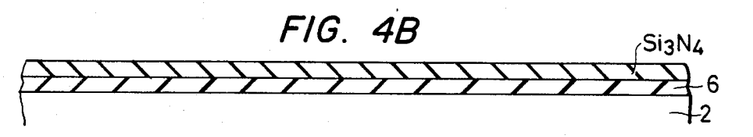

Step B (FIG. 4B)

The entire surface of the oxide layer 6 is covered with a layer of nonoxidizable material. (By the term "nonoxidizable material" is meant a material that is not easily oxidized during LOCOS as conducted in Step E below.) An $Si_3N_4$ layer covering the entire surface of the oxide layer 6 is then formed to a thickness of 1000 to 18000 Å by CVD using SiH$_4$/NH$_3$ at 700 to 850 degrees C.

Figure 4C:
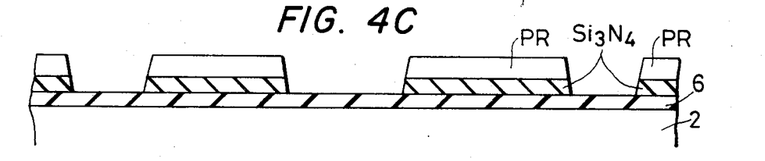

Step C (FIG. 4C)

Figure 4D:
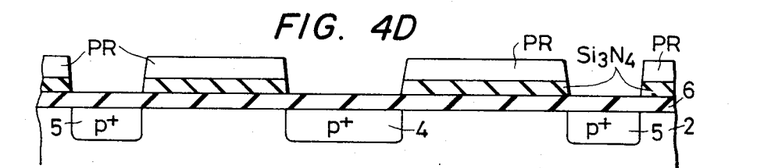

By masking, a layer of photoresist PR is formed on that part of layer of the nonoxidizable material which is not in the area where a control gate region is to be formed (the area above 4 in FIG. 4D) and the surrounding area where a shielding gate region is to be formed (the area above 5 in FIG. 4D). Then, the layer of nonoxidizable material in the area where the two gate regions are to be formed is etched away. If the layer of nonoxidable material is an Si$_3$N$_4$ layer, it can be removed by plasma etching using CF$_4$ or CF$_4$+O$_2$ as an etchant.

Step D (FIG. 4D)

Using photoresist PR and the layer of nonoxidizable layer as a mask, a p$^+$ control gate region 4 and a p$^+$ shielding gate region 5 are formed under the oxide layer 6 by implanting boron ions to a depth of 0.1 to 1.0 microns at an impurity dosage of 10$^{14}$ to 10$^{16}$ cm$^{-3}$. The depth of each gate region is increased to 0.5 to 5.0 microns by subsequent oxidation in Step E. Injection of boron may be achieved by thermal diffusion rather than by ion implantation.

Figure 4E:
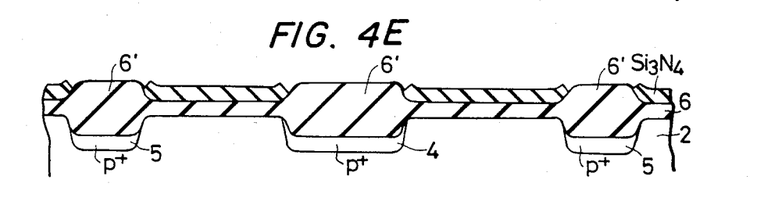

Step E (FIG. 4E)

The two gate regions 4 and 5 are subjected to LOCOS to form an oxide layer 6' of a thickness of 5000 Å to 1 micron in the upper part of each gate region. This can be achieved by wet oxidation at 1000 to 1100 degrees C. for a period of 30 minutes to 3 hours.

Figure 4F:
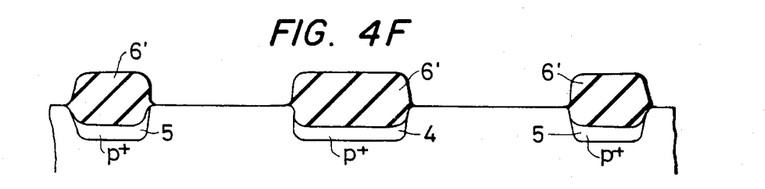

Step F (FIG. 4F)

A photoresist layer is formed on the oxide layer 6' and the unwanted portion of the nonoxidizable layer is removed. Subsequently, the oxide layer 6 is removed by wet etching. If the layer of nonoxidizable material is an Si$_3$N$_4$ layer, it may be removed by plasma etching using CF$_4$ or CF$_4$+O$_2$ as an etchant.

Figure 4G:
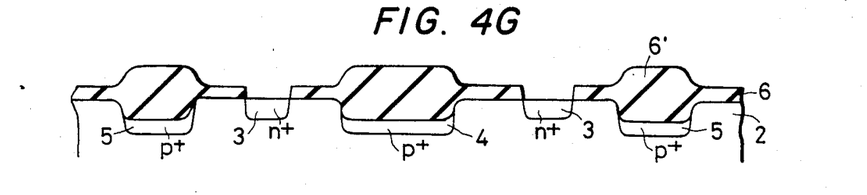

Step G (FIG. 4G)

The entire surface of the wafer that is defined by the oxide layer 6' is oxidized at 100 degrees C. for 30 minutes to again form an oxide layer 6 about 5000 Å thick. Then, the areas other than where the drain region is to be formed (i.e. the area above 3 in FIG. 4G) are masked and the oxide layer 6 in the area where the drain region is to be formed is removed. Thereafter, As and/or P ions are implated into the corresponding area of the epitaxial layer to form an n$^+$ drain region 3. This drain layer has an imprurity concentration of 10$^{14}$ to 16$^{16}$ cm$^{-3}$ and is formed generally to a depth of 0.1 to 0.5 microns. Ion implantation as a method of forming the drain region 3 may be replaced by the thermal diffusion of As and/or P in a vacuum or in a closed vessel, or by thermal diffusion from phospho-arsenosilicate glass.

Figure 4H:
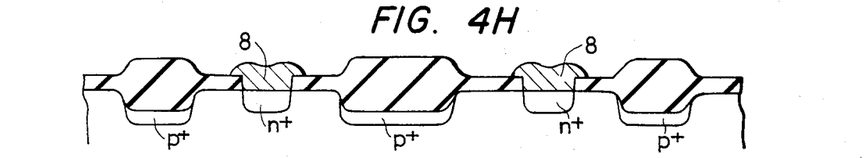

Steps H (FIG. 4H)

A first layer of conductive material is deposited on the entire surface of the wafer. Suitable conductive materials are P-doped polycrystalline silicon (DOPOS), high-melting metal silicide such as molybdenum silicide, and SnO$_2$.DOPOS; and SnO$_2$.DOPOS is particularly preferred. The deposition of a DOPOS layer is effected by CVD using a mixture of SiH$_4$ and PH$_3$ gases. Following masking, the first layer of conductive material in areas other than that above the drain region 3 is etched away so as to form a drain electrode 8 on the drain region 3. If DOPOS is used as the conductive material, the DOPOS layer in areas other than that above the drain region 3 is preferably removed by plasma etching using CF$_4$, CF$_4$+O$_2$ or PCl$_3$ as an etchant.

Figure 4I:
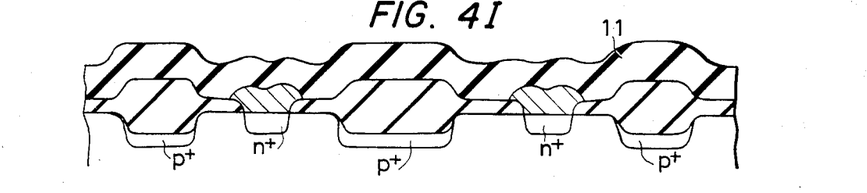

Step I (FIG. 4I)

The entire surface of the wafer is then covered with a first insulating layer 11. This is generally accomplished by depositing phosphosilicate glass (PSG) on the entire surface of the wafer by CVD using SiH$_4$/O$_2$/PH at about 400 degrees C. or SiH$_4$/B$_2$O/PH$_3$ at about 750 degrees C.

Figure 4J:
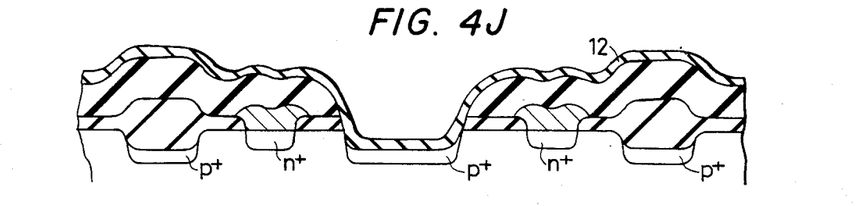

Step J (FIG. 4J)

Following masking, the first insulating layer 11 and oxide layer 6' on the control gate region 4 are removed by wet etching. Then, the entire surface of the wafer is covered with a second insulating layer 12. This second insulating layer 12 is used to form a capacitor in the control gate region 4. Suitable insulating materials includes Si$_3$N$_4$, SiO$_2$, Al$_2$O$_3$ and ALN; Si$_3$N$_4$ is particularly preferred since it has a high dielectric constant and provides a good film at low temperatures. If the insulating layer 12 is made of Si$_3$N$_4$, it is formed to a thickness of 50 to 1000 Å by CVD using SiH$_4$/NH$_3$ at 400 to 700 degrees C.

Figure 4K:
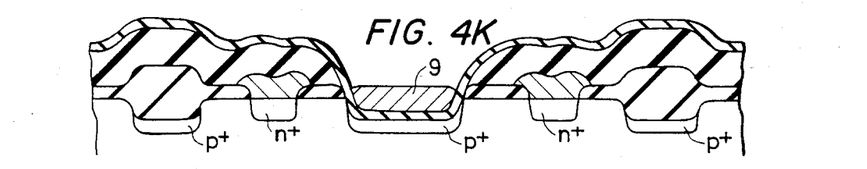

Step K (FIG. 4K)

After covering the entire surface of the wafer with a second conductive layer, masking and etching are performed to etch away the second conductive layer in areas other than above the control gate region 4, thereby forming a control gate electrode 9 on the second insulating layer in the area defined by the control gate region 4. Since it is located on the light-receiving control gate region 4, the electrode 9 should as transparent as possible and generally have a thickness between 2000 and 5000 Å. The control gate electrode 9 is made of a conductive material such as Sb-doped SnO$_2$, DOPOS, In$_2$O$_3$, Ta$_2$O$_3$ or Al. Particularly preferred are Sb-doped SnO$_2$ and DOPOS. If Sb-doped SnO$_2$ is used as the conductive material, a layer thereof is deposited on the entire surface of the wafer by CVD using SnCl$_2$/SbCl$_2$.

Following masking, the SnO$_2$ layer in areas other than that of the control gate electrode 9 is removed by plasma etching. The preferred etchant is CCl$_4$. If DOPOS is used as the conductive material, a layer thereof is deposited on the entire surface of the wafer by CVD using SiH$_4$/PH$_3$. Following masking, the DOPOS layer, other than in the area of the control gate electrode 9, is removed by plasma etching. The preferred etchant is CF$_4$, CF$_4$+O$_2$ or PCl$_3$. If the photodetector is to detect high-energy radiation such as electron rays, the control gate electrode is preferably made of aluminum.

Figure 4L:
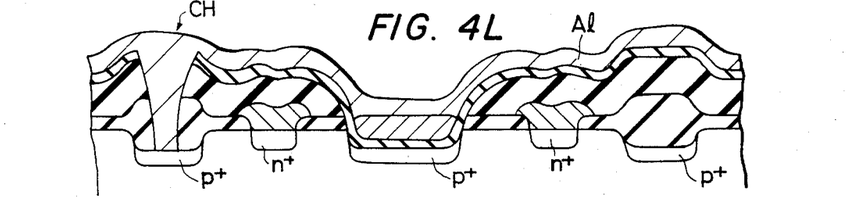

Step L (FIG. 4L)

A contact hole CH is cut in the second insulating layer 12 in part of the shielding gate region 5 through the first insulating layer 11 and oxide layer 6'. More specifically, masking is conducted in the area where the contact hole is to be formed, and after removing the second insulating layer 12 (e.g. Si$_3$N$_4$) by plasma etching, the first insulating layer 11 (e.g. PSG) and the oxide layer 6' are removed by wet etching. As mentioned above, it is not necessary to form one contact hole for every SIT, and the number of contact holes and their positions should be determined taking into consideration the number of SITs in the photodetector and the resistance of the shielding gate region 5. After making the contact hole, the entire surface of the wafer is covered with a metal layer. For example, a layer of aluminum containing 0 to 10% Si is deposited to a thickness of 0.5 to 2.0 microns over the entire surface of the wafer by evaporation or sputtering.

Subsequently, the metal layer is removed from at least the control gate region, and an electrode 10 (see FIG. 3) made of a metal such as aluminum is formed on the entire surface of the other side of the wafer or the surface of Si substrate 1 ($n^+$ source region). The wafer is annealed either in vacuum or in an inert or hydrogen gas atmosphere at 400 to 450 degrees C. By these procedures, the fabrication of a photodetector having SITs of the LOCOS gate type as shown in FIG. 3 is completed.

In the embodiment of FIG. 3, all of the metal layers are removed except for the shielding gate electrode 13 with which the contact hole is filled and the light-shielding film 14 which is integral with the gate electrode and shields light from the shielding gate region. This is not absolutely necessary, provided that at least part of the metal layer which corresponds to the light-receiving control gate region 4 is removed.

In short, the first method for producing a photodetector using an SIT of the LOCOS gate type includes steps of forming in the first principal surface of a silicon wafer the first principal electrode region (drain or source region) with its top flush with the first principal surface (Step G), forming a shielding gate region also in the first principal surface of the silicon wafer with the top of the gate region flush with the first principal surface (Step D), and thereafter forming an oxide film on the upper part of the shielding gate region by selective oxidation (Step E), with the remaining part of the shielding gate region positioned deeper in the silicon wafer than the first principal electrode region.

The photodetector having the SIT of the notched gate type shown in FIG. 5 can be fabricated by the following second process of the present invention, which will be best understood with reference to FIGS. 6A through 6M.

Figure 6A:
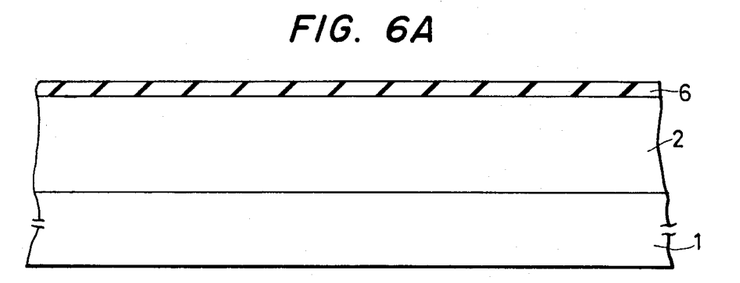
FIGS. 6A through 6M are is a schematic cross-sectional views illustrating a second process for fabricating the photodetector of the present invention.

Step A (FIG. 6A)

As in Step A of the first process, an $n^-$ spitaxial layer 2 and an oxide layer 6 are formed on an Si substrate 1 in that order.

Figure 6B:
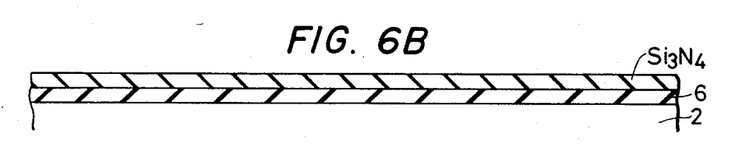

Step B (FIG. 6B)

As in Step B of the first process, the entire surface of the oxide layer 6 is covered with a layer of a nonoxidizable material such as $Si_3N_4$.

Figure 6C:
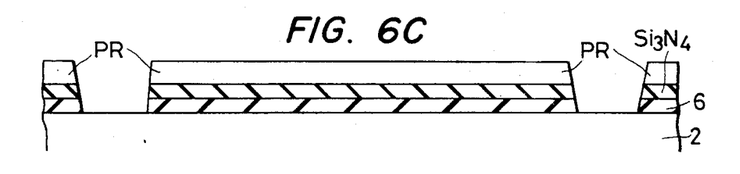

Step C (FIG. 6C)

Following masking, a layer of photoresist PR is formed in areas other than where a shielding gate region is to be formed (i.e. the area above 5 in FIG. 6E), and the layer of nonoxidizable material in the area where the shielding gate region is to be formed is etched away. If the nonoxidizable layer is made of $Si_3N_4$, it is removed by plasma etching using $CF_4$ or $CF_4+O_2$ as an etchant.

Figure 6D:
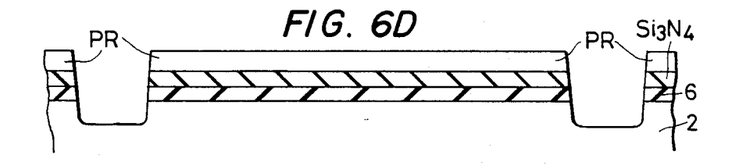

Step D (FIG. 6D)

The oxide layer 6 in the area where the shielding gate region is to be formed and part of the epitaxial layer 2 are etched away to form a notch about 0.2 to 5 microns deep in the epitaxial layer. In order to form a narrow notch, plasma etching using $PCl_3$ as an etchant is preferred. Instead, wet etching may be performed using KOH or $HF-NO_2$ as an etchant.

Figure 6E:
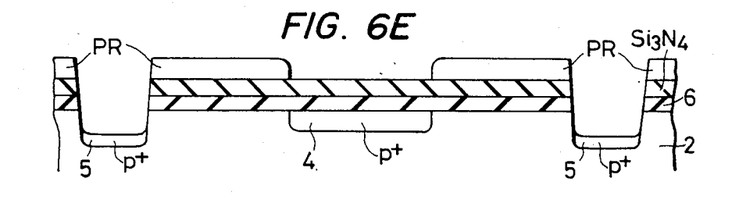

Step E (FIG. 6E)

Following mask alignment, a photoresist layer is formed in areas other than where the control and shielding gate regions are to be formed. Subsequently, as in Step D of the first process, p+ gate regions 4 and 5 are formed. The control gate region 4 is formed by implantation of boron ions through the nonoxidizable layer and the oxide layer 6. Therefore, the control gate region 4 generally has a lower impurity concentration than the shielding gate region 5.

Figure 6F:
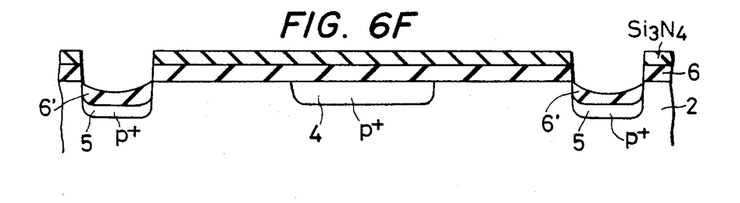

Step F (FIG. 6F)

Using the nonoxidizable layer as a mask, the upper part of the shielding gate region formed at the apex of the notch is subjected to LOCOS so as to form an oxide layer 6' to a thickness of 5000 Å to 1 microns, leaving the shielding gate region in the lower part of the notch. The formation of the oxide film is effected by wet oxidation at 1000 to 1100 degrees C. for 1 hour.

Figure 6G:
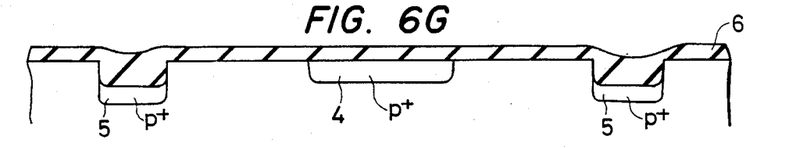
Figure 6H:
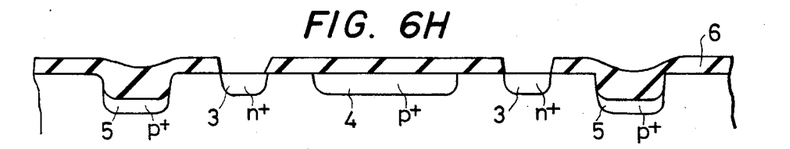
Figure 6I:
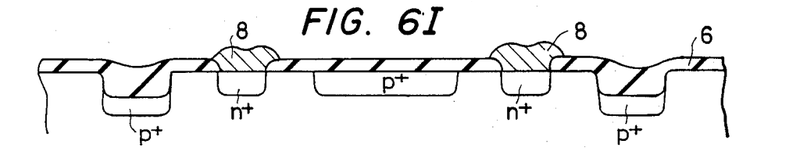
Figure 6J:
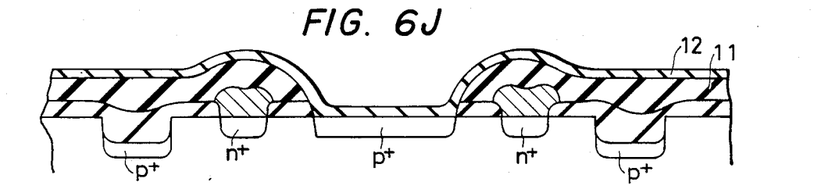
Figure 6K:
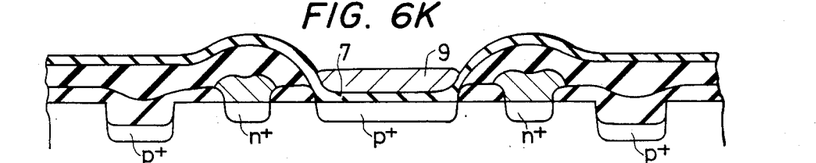
Figure 6L:
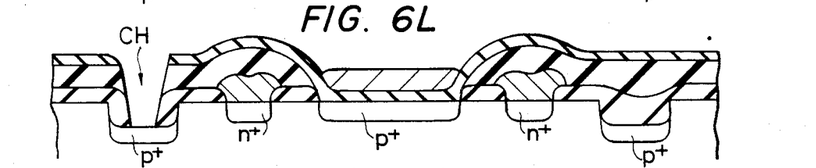
Figure 6M:
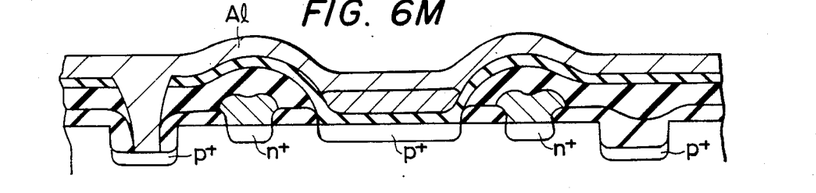

Step G (FIG. 6G)

After forming a photoresist layer on the oxide layer 6', the nonoxidizable layer is removed. Then, the oxide layer 6 is removed by wet etching. If the nonoxidizable layer is made of $Si_3N_4$, it can be removed by plasma etching using $CF_4$ or $CF_4+O_2$ as an etchant. Thereafter, the entire surface of the wafer defined by the oxide layer 6' is oxidized at 1100 degrees C. for about 30 minutes to again form an oxide layer 6 having a thickness of 5000 Å.

Subsequently, Steps H to M are carried out as shown in FIGS. 6H to 6M, respectively, so as to fabricate a photodetector having SITs of the notched gate type, one of which is shown in FIG. 5. Steps H, I, J, K, and L and M are respectively the same as steps G, H, I+J, K and L of the first process of the present invention shown by reference to FIGS. 4A through 4L.

In short, the second method for producing a photodetector using an SIT of the notched gate type includes steps of forming in the first principal surface of a silicon wafer the first principal electrode region (drain or source region) with a top flush with the first principal surface (step H), forming a notch in the first principal surface by ething (Step D), forming a shielding gate region at the apex of the notch (Step E), and thereafter forming an oxide layer in the upper part of the shielding gate region by oxidation (Step F), whereby the remaining part of the shielding gate region is positioned deeper in the silicon wafer than the first principal electrode region.

Generally, the second process enables the shielding gate region to be formed at a deeper position in the silicon wafer than achieved by the first process. Furthermore, by using plasma etching to cut a notch in the silicon wafer, the width of the shielding gate region formed in the second process can be reduced to about one-sixth of the width that can be achieved by the first process. Therefore, in the photodetector fabricated by the second process, more SITs can be packed into a given area than can be achieved by the first process. For these reasons, the second process generally provides better results than the first process, and hence is preferred.

The SITs that form the photodetector of the present invention have a shielding gate region buried completely within the silicon wafer, that is, the top of the gate region is below the surface of the silicon wafer. This configuration achieves highly effective electrical isolation between adjacent pixels. Therefore, the photodetector of the present invention using such SITs is free from interference between SIT pixels, and subsequently free from blooming.

As another advantage of the SITs that form the photodetector of the present invention, the shielding gate region is positioned deeper in the silicon wafer than the drain or source region, thus assuring highly effective isolation between the two regions. Therefore, even if the drain or source region is positioned close to the shielding gate region in the transvere direction (the direction perpendicular to the depth of the silicon wafer) to provide the SIT with a higher sensitivity to light, the junction capacitance between the two regions will still be fairly small, and the possibility of short circuiting of the two regions due to misalignment during the fabrication process is minimized.

The photodetector of the present invention implemented with SITs having the configuration described above can be fabricated easily by either the first or second process discussed above.

We claim:

1. A process for producing a photodetector comprising a vertical static induction transistor, comprising the steps of: formaing a control gate region on a first principal surface of a silicon wafer; forming a shielding gate region on said first principal surface surrounding said control gate region; forming at least one first principal electrode region on said first principal surface in an area between said control region and said shielding gate region; forming a second principal electrode region on a second principal surface of said silicon wafer on the side opposite said first principal electrode region, said first electrode region and said shielding gate region being formed on said first principal surface in such a manner that a top of each of said regions is flush with said first principal surface; and forming an oxide film on the upper part of said shielding gate region by selective oxidation so that remaining portions of said shielding gate region are deeper in said silicon wafer than said first principal electrode region.

2. The process according to claim 1 wherein a plurality of units of said static induction transistor are formed in an array pattern on a single silicon wafer.

3. The process according to claim 2, wherein said plurality of static induction transistor units are arranged in a two-dimensional array.

4. The process according to claim 2 wherein said plurality of static induction transistor units are formed in a one-dimensional linear configuration.

5. The process according to claim 1, wherein a single unit of said static induction transistor is formed.

6. A process for producing a photodetector comprising a vertical static induction transistor, comprising the steps of: forming a control gate region on a first principal surface of a silicon wafer; forming a shielding gate region on said first principal surface surrounding said control gate region; forming at least one first principal electrode region formed on said first principal surface in an area between said control region and said shielding gate region; forming a second principal electrode region on a second principal surface of said silicon wafer on the side opposite said first principal electrode region, wherein said step of forming said at least one first principal electrode region on said first principal surface comprises forming a top surface of said region flush with said first principal surface, etching a notch in said first principal surface, said shielding gate region being formed at an apex of said notch, and forming an oxide film by oxidizing an upper part of said shielding gate region, and wherein remaining portions of said shielding gate region are deeper in said silicon wafer than said first principal electrode region.

7. The process according to claim 6, wherein a plurality of units of said static induction transistor are formed in an array pattern on a single silicon wafer.

8. The process according to claim 7, wherein said plurality of static induction transistors are formed in a two-dimensional array.

9. The process according to claim 7, wherein said plurality of static induction transistor units are formed in a one-dimensional linear configuration.

10. The process according to claim 6, wherein a single unit of said static induction transistor is formed.

* * * * *